(12) United States Patent
Pal et al.

(10) Patent No.: US 7,670,934 B1
(45) Date of Patent: Mar. 2, 2010

(54) METHODS FOR FABRICATING MOS DEVICES HAVING EPITAXIALLY GROWN STRESS-INDUCING SOURCE AND DRAIN REGIONS

(75) Inventors: Rohit Pal, Fishkill, NY (US); Frank Bin Yang, Mahwah, NJ (US)

(73) Assignee: GlobalFoundries Inc., Grand Caymen (KY)

( * ) Notice: Subject to any disclaimer, the term of this patent is extended or adjusted under 35 U.S.C. 154(b) by 0 days.

(21) Appl. No.: 12/359,764

(22) Filed: Jan. 26, 2009

(51) Int. Cl.
*H01L 21/20* (2006.01)
*H01L 21/36* (2006.01)

(52) U.S. Cl. ................................. 438/481; 257/E21.09

(58) Field of Classification Search ................ 438/478, 438/481; 257/E21.09
See application file for complete search history.

(56) References Cited

U.S. PATENT DOCUMENTS 7,566,605 B2 * 7/2009 Shifren et al. ............... 438/199

| 2007/0048907 A1* | 3/2007 | Lee et al. | 438/142 |
| 2008/0191244 A1* | 8/2008 | Kim et al. | 257/190 |
| 2009/0068810 A1* | 3/2009 | Tsai et al. | 438/300 |

* cited by examiner

*Primary Examiner*—W. David Coleman
*Assistant Examiner*—Christine Enad
(74) *Attorney, Agent, or Firm*—Ingrassia Fisher & Lorenz, P.C.

(57) ABSTRACT

Methods of fabricating a semiconductor device on and in a semiconductor substrate having a first region and a second region are provided. In accordance with an exemplary embodiment of the invention, a method comprises forming a first gate stack overlying the first region and a second gate stack overlying the second region, etching into the substrate first recesses and second recesses, the first recesses aligned at least to the first gate stack in the first region, and the second recesses aligned at least to the second gate stack in the second region, epitaxially growing a first stress-inducing monocrystalline material in the first and second recesses, removing the first stress-inducing monocrystalline material from the first recesses, and epitaxially growing a second stress-inducing monocrystalline material in the first recesses, wherein the second stress-inducing monocrystalline material has a composition different from the first stress-inducing monocrystalline material.

21 Claims, 3 Drawing Sheets

METHODS FOR FABRICATING MOS DEVICES HAVING EPITAXIALLY GROWN STRESS-INDUCING SOURCE AND DRAIN REGIONS

FIELD OF THE INVENTION

The present invention generally relates to methods for fabricating semiconductor devices, and more particularly relates to methods for fabricating metal oxide semiconductor devices having epitaxially-grown, stress-inducing source and drain regions.

BACKGROUND OF THE INVENTION

The majority of present day integrated circuits (ICs) are implemented by using a plurality of interconnected field effect transistors (FETs), also called metal oxide semiconductor field effect transistors (MOSFETs or MOS transistors). The ICs are usually formed using both P-channel and N-channel FETs in which case the IC is referred to as a complementary MOS or CMOS IC. There is a continuing trend to incorporate more circuitry having greater complexity on a single IC chip. To continue this trend, the size of each individual device in the circuit and the spacing between device elements, or the pitch, are reduced for each new technology generation. Further, as the pitch is scaled to smaller dimensions, the thickness of gate insulators and electrodes used in the gate stacks of these devices is also reduced.

It is well known that the performance of a transistor device can be improved by applying an appropriate stress to the channel region to enhance the mobility of majority carriers. For example, the mobility of electrons, the majority carrier in an N-channel MOS (NMOS) transistor can be increased by applying a tensile longitudinal stress to the channel. Similarly, the mobility of holes, the majority carrier in a P-channel MOS (PMOS) transistor, can be increased by applying a compressive longitudinal channel stress. Tensile and compressive stress liner films have been incorporated as channel stress-inducing layers for both NMOS and PMOS devices, respectively, for the 65 nm, 45 nm, and 32 nm technology generations. However, because the thickness of these films decreases with device pitch, the stress applied, and thus the performance benefit achieved, also declines with each new generation. Further, as the thickness of gate stacks is reduced in advanced devices, the likelihood of channel contamination by impurity dopants from high energy ion implantation processes is increased.

Accordingly, it is desirable to provide methods for fabricating MOS devices having epitaxially-grown, stress-inducing source and drain regions. In addition, it is desirable to provide methods for epitaxially growing stress-induced source and drain regions using fewer process steps. Further, is it also desirable to provide such methods that alleviate the need to use ion implantation as a means of doping source and drain regions. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods are provided for fabricating a semiconductor device on and in a semiconductor substrate having a first region and a second region. In accordance with an exemplary embodiment of the invention, one method comprises forming a first gate stack overlying the first region and a second gate stack overlying the second region, etching into the substrate first recesses and second recesses, the first recesses aligned at least to the first gate stack in the first region, and the second recesses aligned at least to the second gate stack in the second region, epitaxially growing a first stress-inducing monocrystalline material in the first and second recesses, removing the first stress-inducing monocrystalline material from the first recesses, and epitaxially growing a second stress-inducing monocrystalline material in the first recesses, wherein the second stress-inducing monocrystalline material has a composition different from the first stress-inducing monocrystalline material.

A method is provided for fabricating a semiconductor device on and in a semiconductor substrate having a first region and a second region in accordance with another exemplary embodiment of the invention. The method comprises the steps of forming a first gate stack having first sidewalls overlying the first region, forming a second gate stack having second sidewalls overlying the second region, forming first sidewall spacers overlying the first sidewalls of the first gate stack, forming second sidewall spacers overlying the second sidewalls of the second gate stack, etching into the substrate first recesses and second recesses, the first recesses disposed in the first region and aligned to the first gate stack and the first sidewall spacers, and the second recesses disposed in the second region and aligned to the second gate stack and the second sidewall spacers, epitaxially growing an in situ-doped compressive stress-inducing monocrystalline material in the first and second recesses, removing the in situ-doped compressive stress-inducing monocrystalline material from the first recesses, and epitaxially growing an in situ-doped tensile stress-inducing monocrystalline material in the first recesses.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
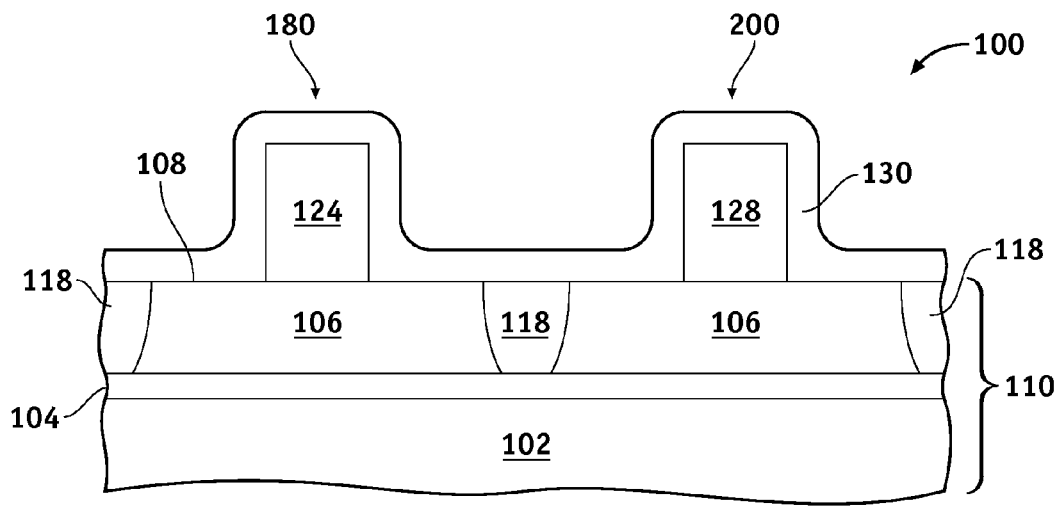
FIGS. 1-7 illustrate schematically, in cross-section, methods for fabricating a semiconductor device having in situ-doped, epitaxially-grown stress-inducing source and drain regions in accordance with an exemplary embodiment of the present invention.

The following detailed description of the invention is merely exemplary in nature and is not intended to limit the invention or the application and uses of the invention. Furthermore, there is no intention to be bound by any theory presented in the preceding background of the invention or the following detailed description of the invention.

Conventionally, epitaxially forming source and drain regions for NFET and PFET devices involves a separate set of processing steps for each device type. Following the formation of gate stacks in both PFET and NFET regions, a first set of processing steps is used to form the source and drain of one of these device types. This sequence is followed by a second, similar set of steps to form the source and drain of the other device type. Each set of processing steps typically includes: 1) deposition of a blanket dielectric layer in both NFET and PFET regions, 2) lithographic formation of a soft mask overlying the first (PFET or NFET) region, 3) an anisotropic etch of the dielectric layer in the second (unprotected) region to form sidewall spacers on the gate stack in that region, 4) an anisotropic etch to form source/drain recesses self-aligned to the gate stack in the second region, 5) growth of a suitably stress-inducing epitaxial material (tensile for NFET or compressive for PFET) in the source/drain recesses of the second region, and 6) removal of the dielectric layer in the first region. Masking protection then is applied to the completed device, and these processing steps are repeated for the other device type.

The various embodiments of the present invention describe methods for fabricating NMOS and PMOS transistors having epitaxially-grown, stress-inducing source and drain regions. In contrast to the conventional method described above, these methods include a single etch step to form source and drain recesses self-aligned to the gate stacks of both NMOS and PMOS devices. The recesses of both device types are filled with a first epitaxial monocrystalline material having either compressive or tensile stress-inducing properties. The first epitaxial material remains in the source/drain recess of the device type it is suited for, and is removed from the other recess and subsequently replaced with a second epitaxial monocrystalline material having stress-inducing properties opposite those of the first material. Accordingly, NMOS and PMOS devices may be fabricated having performance-enhancing stress-inducing source/drain regions using a simplified processing sequence. Such a process sequence requires fewer lithography and etch steps when compared to alternative processes. In accordance with other embodiments, the source and drain regions may be in situ-doped during the epitaxial growth process with P or N-type impurity dopants suitable for each device.

FIGS. 1-7 illustrate schematically, in cross section, methods for forming a semiconductor device 100 having PMOS and NMOS transistors with epitaxially-grown stress-inducing source and drain regions, in accordance with various exemplary embodiments of the invention. While the fabrication of portions of one NMOS and one PMOS transistor is illustrated, it will be appreciated that the methods depicted in FIGS. 1-7 can be used to fabricate any number of such transistors. Various steps in the manufacture of MOS components are well known and so, in the interest of brevity, many conventional steps will only be mentioned briefly herein or will be omitted entirely without providing the well known process details.

Referring to FIG. 1, in accordance with an exemplary embodiment, the method begins by providing a semiconductor substrate 110. The semiconductor substrate can be silicon, germanium, a III-V material such as gallium arsenide, or another semiconductor material. Semiconductor substrate 110 will hereinafter be referred to for convenience, but without limitation, as a silicon substrate. The term "silicon substrate" is used herein to encompass the relatively pure silicon materials typically used in the semiconductor industry as well as silicon admixed with other elements such as germanium, carbon, and the like. The silicon substrate may be a bulk wafer comprising monocrystalline silicon or, as shown in FIG. 1, may be a thin layer 106 of monocrystalline silicon on an insulating layer 104 (commonly know as silicon-on-insulator, or SOI) that, in turn, is supported by a carrier wafer 102. The thickness of thin silicon layer 106 may vary depending on the intended application of semiconductor device 100 and, in one embodiment, layer 106 is from about 80 nanometers (nm) to about 100 nm thick. Isolation regions 118 are formed that extend through thin silicon layer 106 to insulating layer 104. The isolation regions are preferably formed by well known shallow trench isolation (STI) techniques in which trenches are etched into thin silicon layer 106, the trenches are filled with a dielectric material such as a deposited silicon oxide, and the excess silicon oxide is removed by chemical mechanical planarization (CMP). Isolation regions 118 are used to electrically isolate an NFET region 180 and a PFET region 200 upon which gate stacks for NFET and PFET transistors, respectively, are subsequently formed. At least a surface region 108 of silicon substrate 110 is impurity doped, for example by forming an N-type well region in PFET region 200 and a P-type well region in NFET region 180 for the fabrication of PFET and NFET transistors, respectively.

Gate stacks 124 and 128 are formed overlying NFET and PFET regions 180 and 200, respectively. Gate stacks 124 and 128 typically each comprise a gate insulator (not shown) overlying the surface of thin silicon layer 106 and a gate electrode overlying the gate insulator. The composition of the gate insulator will depend on the technology generation and intended application of device 100 and may comprise either thermally grown silicon dioxide ($SiO_2$), or a deposited dielectric such as silicon oxide ($SiO_x$) where x is a number greater than zero, silicon nitride, silicon oxynitride, or a high dielectric constant (high-k) material such as, for example, hafnium dioxide ($HfO_2$), or a hafnium silicon oxide ($HfSi_xO_y$) where x and y are greater than zero, or the like, or a combination of these. It should be understood that, as used herein, references to deposited films of either silicon nitride or silicon oxynitride are intended to include both stoichiometric and non-stoichiometric compositions of these materials. The composition of the gate electrode for each gate stack is also application/technology generation dependent and may comprise, for example, impurity-doped polycrystalline silicon. The gate electrode may also be of a composite type having a layer of polycrystalline silicon overlying a metal-comprising layer such as, for example, titanium nitride (TiN), tantalum nitride (TaN), tungsten nitride (WN), or the like, as is well known in the art. Each of gate stacks 124 and 128 also typically includes a capping layer overlying the gate electrode comprising, for example, silicon nitride, $SiO_x$, or silicon oxynitride or other suitable material to protect the gate electrode during subsequent processing steps.

Next, a sidewall spacer layer 130 comprising a dielectric material such as, for example, silicon oxynitride or preferably silicon nitride, is blanket-deposited overlying the surface of device 100 including regions 180 and 200 and gate stacks 124 and 128. Sidewall spacer layer 130 may be deposited, for example, by a plasma enhanced chemical vapor deposition (PECVD) process using silane ($SiH_4$) and either ammonia ($NH_3$) or nitrogen ($N_2$) in the presence of an argon (Ar) plasma. Layer 130 may also be deposited using low pressure chemical vapor deposition (LPCVD) with either $SiH_4$ and $NH_3$, or with dichlorosilane ($SiH_2Cl_2$) and $NH_3$. The thickness of sidewall spacer layer 130 is in a range of from about 5 nm to about 15 nm.

Figure 2:
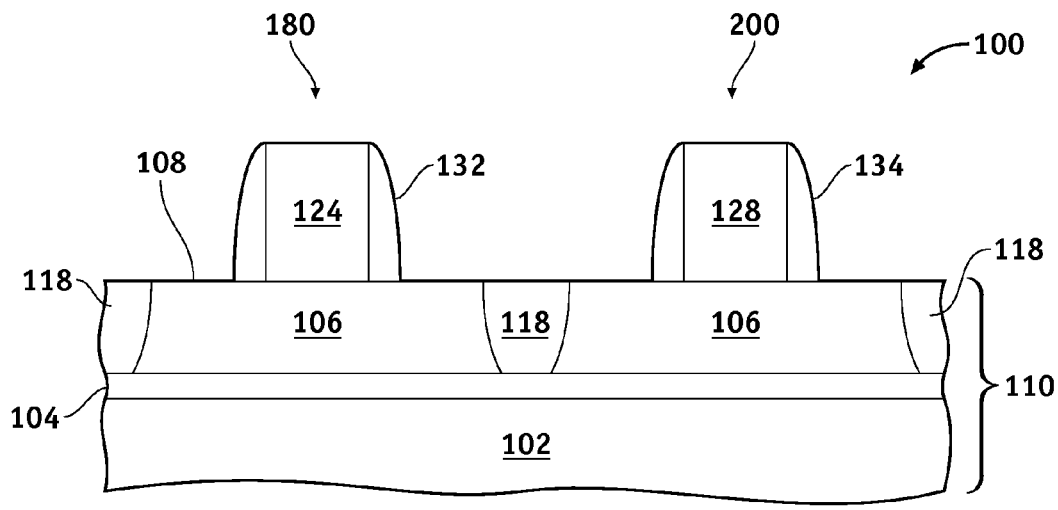

The method continues with the anisotropic etch of sidewall spacer layer 130 to form first sidewall spacers 132 and 134 on the sidewalls of gate stacks 124 and 128, respectively, as illustrated in FIG. 2. This etch may be performed using, for example, plasma or reactive ion etching (RIE) using chemistries based upon carbon trifluoride/oxygen ($CHF_3/O_2$) to etch silicon nitride, and $CHF_3$ or carbon tetrafluoride ($CF_4$) to etch silicon oxynitride. This etch is performed so as to remove sidewall spacer layer 130 from the region of thin silicon layer 106 whereon source and drain recesses are to be subsequently formed, and to form first sidewall spacers 132 and 134 to the desired thickness. The thickness of first sidewall spacers 132 and 134 will depend upon the thickness of sidewall spacer layer 130 and the intended application and technology generation that device 100 is fabricated for, and in one embodiment, is between about 4 nm and about 12 nm at their base along surface region 108.

Figure 3:
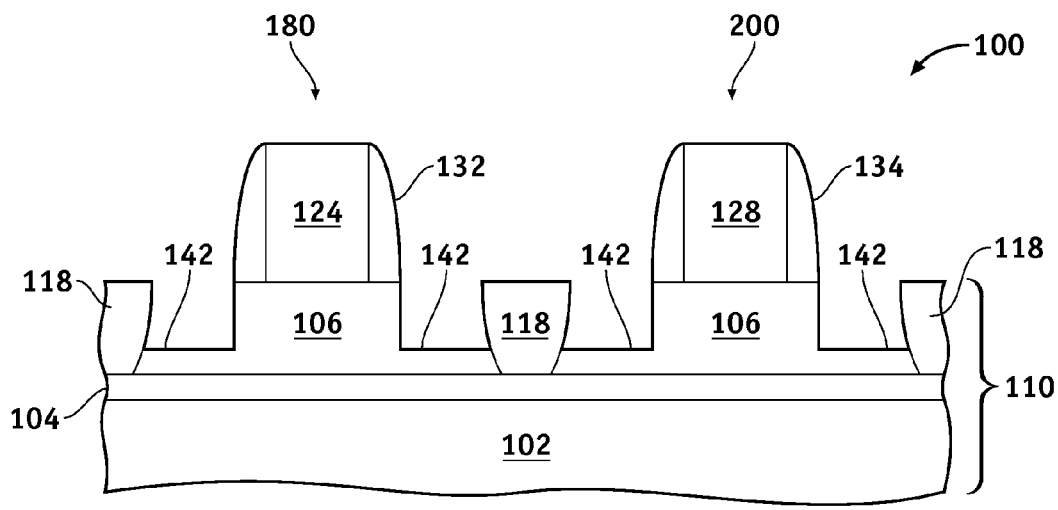

Referring to FIG. 3, source and drain recesses 142 are anisotropically etched into thin silicon layer 106 proximate and self-aligned to gate stacks 124 and 128 using these gate stacks and first sidewall spacers 132 and 134 as etch masks. During this etch, the thickness of first sidewall spacers 132 and 134 may be somewhat eroded. Source and drain recesses 142 can be etched by, for example, RIE using a hydrogen bromide (HBr) and $O_2$ chemistry. According to one exemplary embodiment, source and drain recesses 142 are etched to a depth of from about 50 nm to about 90 nm, and preferably to a depth of between from about 50 nm to about 65 nm deep. Preferably, the etch depth is controlled to maintain at least about 10 nm of thin silicon layer 106 between the bottom of recesses 142 and insulating layer 104.

Figure 4:
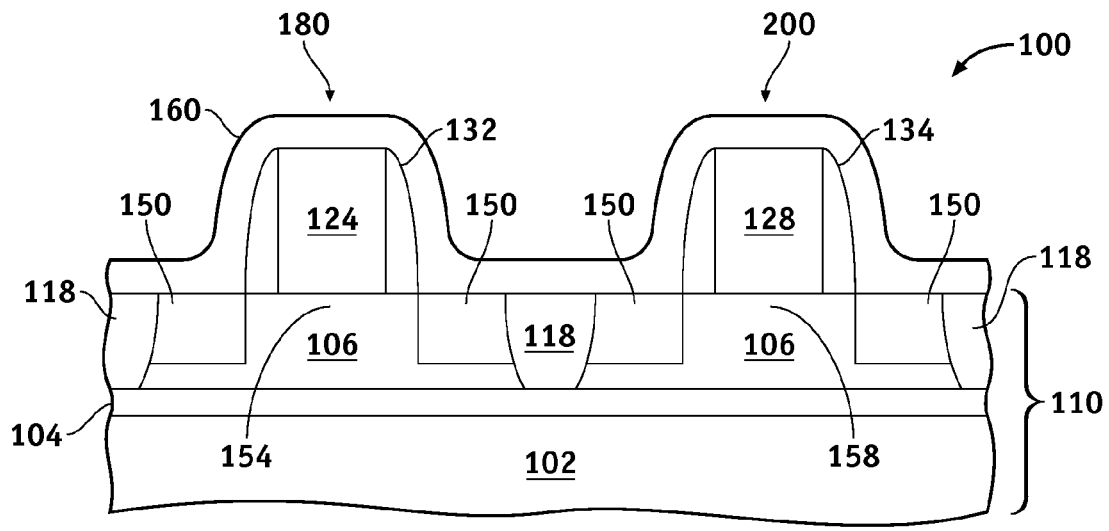

Referring to FIG. 4, a first stress-inducing monocrystalline material layer 150 comprising silicon (Si) is epitaxially grown in source and drain recesses 142 of both NFET and PFET regions 180 and 200, respectively. The epitaxial process is performed selectively to silicon surfaces so that growth on non-silicon surfaces such as first sidewall spacers 132 and 134, and the gate electrode capping layer overlying gate stacks 124 and 128 is prevented. The first stress-inducing monocrystalline material layer 150 can be grown, for example, by the reduction of $SiH_4$ or $SiH_2Cl_2$ in the presence of hydrochloric acid (HCl) added as an etchant to control growth selectivity. Layer 150 is formed as a compressive stress-inducing layer by the introduction of additional compressive stress-inducing elements. These elements include, for example, germanium (Ge) or tin (Sn), which are thereby incorporated into the crystalline lattice to form embedded silicon/germanium (eSi:Ge) or silicon/tin (eSi:Sn) layers, respectively. Preferably, the embedded compressive stressor is eSi:Ge that may be formed by a high temperature reaction between the silicon precursors and germane gas ($GeH_4$), with HCl gas added as the etchant. These materials may be used to apply a compressive stress to channels 154 and 158 underlying gate stacks 124 and 128, respectively. In another embodiment, the eSi:Ge material includes up to about 50 atomic % Ge, and preferably contains from about 20 atomic % to about 30 atomic % Ge. In a further exemplary embodiment, monocrystalline material layer 150 is impurity-doped with a P-type dopant element such as, for example, boron (B) by adding, for example, diborane ($B_2H_6$) to epitaxial growth reactants during formation. The use of such a compressive stress-inducing source and drain material combined with a P-type dopant is especially efficacious to the performance of a PFET device.

Next, a hard mask layer 160 comprising a dielectric material such as, for example, silicon oxynitride or preferably silicon nitride, is blanket-deposited overlying regions 180 and 200 including gate stacks 124 and 128, first spacers 132 and 134, and first stress-inducing monocrystalline material layer 150. Hard mask layer 160 may be deposited in a manner previously described with reference to sidewall spacer layer 130 to a thickness in a range of from about 5 nm to about 15 nm. In one embodiment, hard mask layer 160 is deposited as a compressively stressed layer. Hard mask layer 160 can be deposited as a compressively stressed layer by adjusting the deposition reactants and deposition conditions in known manner.

Figure 5:
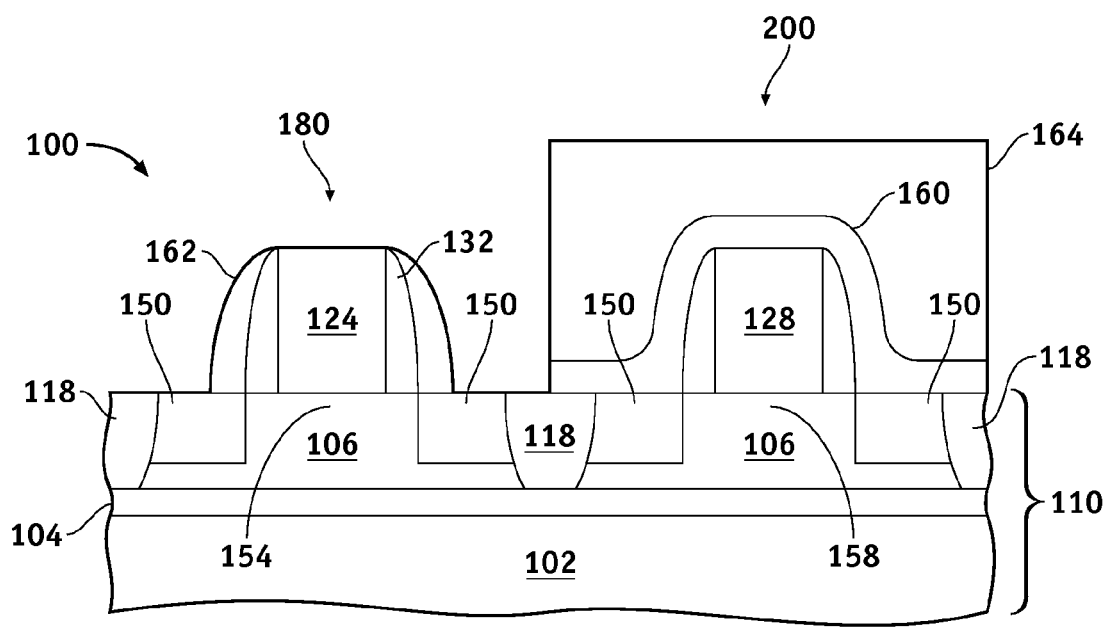

A photoresist mask 164 then is formed overlying hard mask layer 160 in PFET region 200, as illustrated in FIG. 5. Photoresist mask 164 is formed using a suitable lithography process and is used as an etch mask for the anisotropic etch of hard mask layer 160 in NFET region 180. Due to the anisotropy of this etch, second sidewall spacers 162 are formed overlying first sidewall spacers 132 and overlying a portion of first stress-inducing monocrystalline material layer 150. An etch process previously described with reference to sidewall spacer layer 130 may be used, and is controlled to form second sidewall spacers 162 having a desired thickness. This thickness is generally about 80% of the thickness of hard mask layer 160 or is from about 4 nm to about 12 nm thick. Photoresist mask 164 then is removed using a conventional ashing and/or solvent stripping process.

Figure 6:
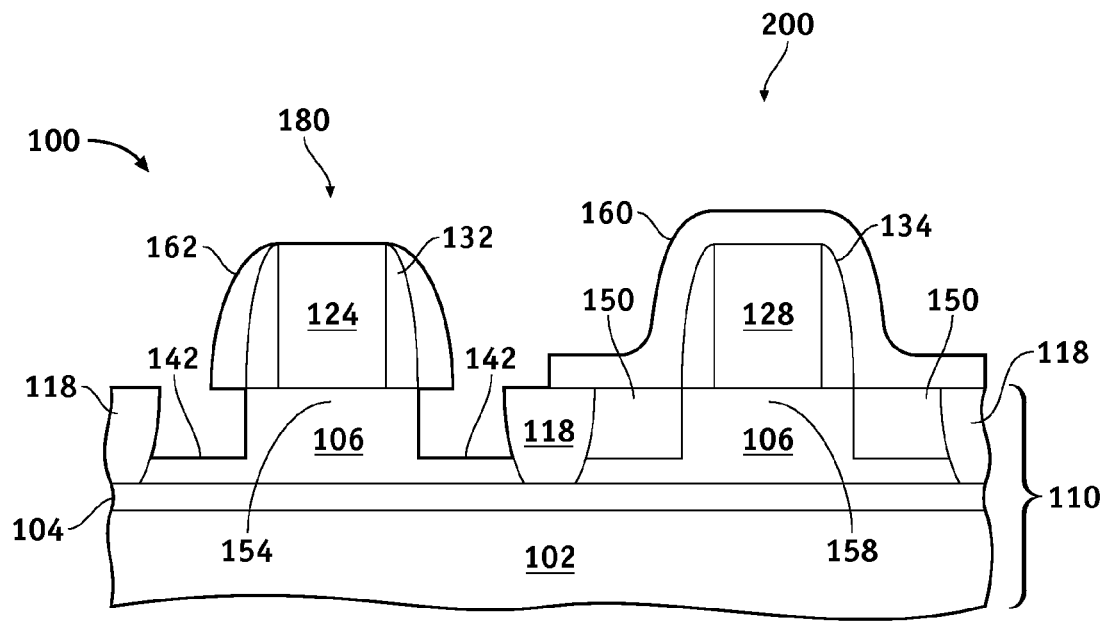

Next, because a compressive stress-inducing film is not performance enhancing to an NFET device to be formed in region 180, first stress-inducing monocrystalline material layer 150 is isotropically removed from NFET region 180 using a suitable wet or dry etch process, as illustrated in FIG. 6. In one exemplary embodiment, this etch process includes immersion for approximately 10 minutes in a "standard clean #1" (SC-1) solution comprising ammonium hydroxide, hydrogen peroxide, and water ($NH_4OH/H_2O_2/H_2O$). In another embodiment, the temperature of this solution is elevated to about 55° C. or higher. Hard mask layer 160 protects the structures in PFET region 200 including layer 150 during this etch.

Figure 7:
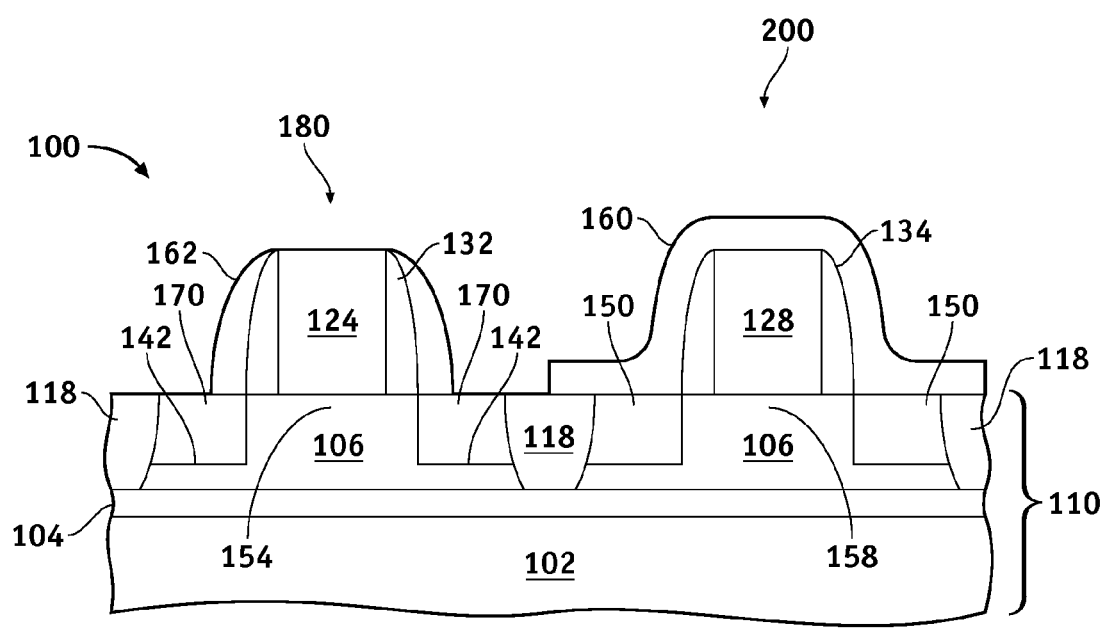

A second stress-inducing monocrystalline material layer 170 comprising silicon and having tensile stress-inducing properties suited to an NFET device is selectively epitaxially grown in source and drain recesses 142 in NFET region 180, as illustrated in FIG. 7. In one embodiment, epitaxial growth of layer 170 may be performed in a similar manner as described previously with reference to first stress-inducing monocrystalline material layer 150 except for the change in reactants. For example, a tensile-stress-inducing element such as, for example, carbon (C), or a combination of tensile-stress-inducing elements is added to the epitaxial reactants. Layer 170 thereby forms as a monocrystalline embedded silicon carbon (eSi:C) layer that applies a tensile stress to channel 154. The deposition gases used to form eSi:C typically include $SiH_4$, methyl silane ($Si_2H_6$), or derivatives of these chemical species to provide a carbon source. The typical etchant gases are HCl and/or chlorine ($Cl_2$). In another embodiment, second stress-inducing monocrystalline material layer 170 includes up to about 3 atomic % C and preferably includes from about 1% to about 2% C. Because of the presence of patterned hard mask layer 160, the second stress-inducing monocrystalline layer grows only in the source and drain regions of the NMOS transistor. In a further exemplary embodiment, compounds such as, for example, arsine ($AsH_3$) and/or phosphine ($PH_3$) are added to the epitaxial reactants to in situ dope layer 170 with N-type impurity dopant elements arsenic (As) and/or phosphorous (P), respectively. The use of such a tensile stress-inducing source and drain material comprising an N-type dopant is especially performance enhancing to an NFET device.

Accordingly, this method provides tensile and compressive stress-inducing source and drain regions for NFET and PFET devices, respectively. A compressive stress-inducing layer suitable to a PFET device is epitaxially grown in the source and drain regions of both PFET and NFET devices, and is subsequently replaced in the NFET device with a suitable tensile stress-inducing layer. By using the sequence described above, compressive stress-inducing materials such as eSi:Ge are deposited before tensile-stress inducing materials such as eSi:C. Such compressive stress-inducing materials typically better retain their stress-inducing properties when subjected to subsequent elevated temperature processing, such as deposition of hard mask layer 160, compared to tensile-stress inducing materials such as eSi:C that tend to relax under such conditions. Further, by growing the compressive stress-inducing layer in both NFET and PFET source/drain regions during the same epitaxial process, the area of epitaxial growth relative to the total substrate area, also referred to as process loading, is substantially increased. This factor may be beneficial in achieving consistency in film thickness because the growth rate of epitaxial materials in small regions, or at low levels of process loading, is often less controllable than for growth in larger regions. Achieving a target film thickness at low loading levels is thus more difficult and may result in film thickness inconsistencies across a substrate and from substrate-to-substrate. However, while the above-described embodiments provide for the formation of a compressive stress-inducing material followed by the formation of a tensile stress-inducing material, the reverse sequence is also contemplated herein. In this regard, the tensile stress-inducing material may be epitaxially grown first as may be desired for particular device applications and/or processing.

Accordingly, methods have been provided for the fabrication of PFET and NFET devices having epitaxially-formed, stress-inducing source and drain regions. A first monocrystalline material having either compressive or tensile stress-inducing properties is epitaxially grown in both PFET and NFET source/drain regions. The first material remains in the source/drain of one device type (PFET or NFET) suited to its stress-inducing properties, and is subsequently replaced in the other device type by a second material having opposite stress-inducing properties. Formation of epitaxial material in both PFET and NFET devices during the same growth process increases process loading and thereby enhances growth rate control of the epitaxial process. In addition, the process sequences described herein require fewer lithography and etch steps than required by conventional processes. Furthermore, epitaxially-grown compressive and tensile stress-inducing source/drain regions may be in situ impurity-doped, thus eliminating an impurity implantation process. Accordingly, fabrication of gate stacks having thinner gate insulator and electrode layers required for advanced generation devices is enabled without the risk of channel contamination by implanted dopants.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method of fabricating a semiconductor device on and in a semiconductor substrate having a first region and a second region, the method comprising the steps of:
    forming a first gate stack overlying the first region and a second gate stack overlying the second region;
    etching into the substrate first recesses and second recesses, the first recesses aligned at least to the first gate stack in the first region, and the second recesses aligned at least to the second gate stack in the second region;
    epitaxially growing a first stress-inducing monocrystalline material in the first and second recesses;
    removing the first stress-inducing monocrystalline material from the first recesses; and
    epitaxially growing a second stress-inducing monocrystalline material in the first recesses, wherein the second stress-inducing monocrystalline material has a composition different from the first stress-inducing monocrystalline material.

2. The method of claim 1, wherein the step of epitaxially growing a first stress-inducing monocrystalline material comprises epitaxially growing a compressive stress-inducing monocrystalline material.

3. The method of claim 2, wherein the step of epitaxially growing a compressive stress-inducing monocrystalline material comprises epitaxially growing a compressive stress-inducing monocrystalline material selected from a group consisting of SiGe and SiSn.

4. The method of claim 3, wherein the step of epitaxially growing a compressive stress-inducing monocrystalline material comprising SiGe comprises epitaxially growing a compressive stress-inducing monocrystalline material comprising a Ge concentration of from about 20 atomic % to about 50 atomic %.

5. The method of claim 1, wherein the step of epitaxially growing a second stress-inducing monocrystalline material comprises epitaxially growing a tensile stress-inducing monocrystalline material.

6. The method of claim 5, wherein the step of epitaxially growing a tensile stress-inducing monocrystalline material comprises epitaxially growing a tensile stress-inducing monocrystalline material comprising SiC.

7. The method of claim 6, wherein the step of epitaxially growing a tensile stress-inducing monocrystalline material comprising SiC comprises epitaxially growing a tensile stress-inducing monocrystalline material comprising a C concentration of from about 1 atomic % to about 2 atomic %.

8. The method of claim 1, wherein the step of epitaxially growing a first stress-inducing monocrystalline material comprises epitaxially growing a first in situ-doped stress-inducing monocrystalline material.

9. The method of claim 8, wherein the step of growing a first in situ-doped stress-inducing monocrystalline material comprises growing a first in situ-doped stress-inducing monocrystalline material comprising a P-type dopant.

10. The method of claim 8, wherein the step of growing a first in situ-doped stress-inducing monocrystalline material comprises growing a first in situ-doped stress-inducing monocrystalline material comprising an N-type dopant.

11. The method of claim 1, wherein the step of epitaxially growing a second stress-inducing monocrystalline material comprises epitaxially growing a second in situ doped stress-inducing monocrystalline material.

12. The method of claim 11, wherein the step of growing a second in situ-doped stress-inducing monocrystalline material comprises growing a second in situ-doped stress-inducing monocrystalline material comprising an N-type dopant.

13. The method of claim 1, wherein the step of etching into the substrate first recesses and second recesses comprises etching into the substrate first recesses and second recesses having a depth in a range of from about 50 nm to about 65 nm.

14. The method of claim 1, further comprising the step of depositing a dielectric layer overlying the first and second regions following the step of epitaxially growing a first stress-inducing monocrystalline material.

15. The method of claim 14, wherein the step of depositing a dielectric layer comprises depositing a compressively-stressed dielectric layer.

16. A method of fabricating a semiconductor device on and in a semiconductor substrate having a first region and a second region, the method comprising the steps of:
    forming a first gate stack having first sidewalls overlying the first region;

forming a second gate stack having second sidewalls overlying the second region;

forming first sidewall spacers adjacent the first sidewalls of the first gate stack;

forming second sidewall spacers adjacent the second sidewalls of the second gate stack;

etching into the substrate first recesses and second recesses, the first recesses disposed in the first region and aligned to the first gate stack and the first sidewall spacers, and the second recesses disposed in the second region and aligned to the second gate stack and the second sidewall spacers;

epitaxially growing an in situ-doped compressive stress-inducing monocrystalline material in the first and second recesses;

removing the in situ-doped compressive stress-inducing monocrystalline material from the first recesses; and epitaxially growing an in situ-doped tensile stress-inducing monocrystalline material in the first recesses.

17. The method of claim 16, wherein the step of epitaxially growing an in situ-doped compressive stress-inducing monocrystalline material comprises epitaxially growing an in situ-doped compressive stress-inducing monocrystalline material selected from a group consisting of SiGe and SiSn.

18. The method of claim 16, wherein the step of epitaxially growing an in situ-doped compressive stress-inducing monocrystalline material comprises epitaxially growing an in situ boron-doped compressive stress-inducing monocrystalline material.

19. The method of claim 16, wherein the step of epitaxially growing an in situ-doped tensile stress-inducing monocrystalline material comprises epitaxially growing an in situ-doped tensile stress-inducing monocrystalline material comprising SiC.

20. The method of claim 16, wherein the step of epitaxially growing an in situ-doped tensile stress-inducing monocrystalline material comprises epitaxially growing an in situ-doped tensile stress-inducing monocrystalline material that is in situ-doped with a dopant selected from a group consisting of phosphorous and arsenic.

21. The method of claim 14, further comprising the step of:

forming first sidewall spacers on the first gate stack and on the second gate stack; and anisotropically etching the dielectric layer to form second sidewall spacers on the first sidewall spacers that are formed on the first gate stack.

* * * * *